(12) United States Patent
Moon et al.

(10) Patent No.: US 8,414,985 B2
(45) Date of Patent: Apr. 9, 2013

(54) PLASMA DEPOSITION OF A THIN FILM

(75) Inventors: Seyoun Moon, Seoul (KR); Wooyoung Kim, Seoul (KR); Sehwon Ahn, Seoul (KR); Dongjoo You, Seoul (KR)

(73) Assignee: LG Electronics, Inc., Seoul (KR)

( * ) Notice: Subject to any disclaimer, the term of this patent is extended or adjusted under 35 U.S.C. 154(b) by 296 days.

(21) Appl. No.: 12/822,406

(22) Filed: Jun. 24, 2010

(65) Prior Publication Data

US 2010/0330299 A1    Dec. 30, 2010

(30) Foreign Application Priority Data

Jun. 24, 2009   (KR) .................. 10-2009-0056320

(51) Int. Cl.
    H05H 1/24    (2006.01)
(52) U.S. Cl. .................. 427/569; 427/570; 427/573
(58) Field of Classification Search .................. 427/569, 427/570, 573
    See application file for complete search history.

(56) References Cited

U.S. PATENT DOCUMENTS

| 6,110,287 A * | 8/2000 | Arai et al. ............... 156/345.34 |
| 6,287,986 B1 | 9/2001 | Mihara |
| 6,358,573 B1 * | 3/2002 | Raoux et al. .................. 427/578 |
| 6,423,242 B1 * | 7/2002 | Kojima et al. .................. 216/79 |
| 2005/0068617 A1 | 3/2005 | Mizuno et al. |
| 2005/0069651 A1 * | 3/2005 | Miyoshi et al. ............... 427/452 |
| 2005/0241762 A1 * | 11/2005 | Paterson et al. .......... 156/345.28 |
| 2006/0105106 A1 | 5/2006 | Balseanu et al. |
| 2008/0038926 A1 | 2/2008 | Zentzek et al. |
| 2008/0230008 A1 * | 9/2008 | Paterson et al. ............ 118/723 E |
| 2008/0271675 A1 * | 11/2008 | Choi et al. .................... 118/715 |
| 2008/0314318 A1 * | 12/2008 | Han et al. .................. 118/723 R |
| 2010/0239757 A1 * | 9/2010 | Murata .................... 427/255.28 |
| 2011/0006040 A1 * | 1/2011 | Savas et al. .................... 216/71 |

FOREIGN PATENT DOCUMENTS

| KR | 2007-0088711 A | 8/2007 |
| WO | WO 2006/055459 A2 | 5/2006 |

OTHER PUBLICATIONS

Yagi, Yasuyuki, "Extraction of electric power from plasma sources using difference in plasma-electrode interactions." Journal of Applied Physics 98, 096104 (2005), pp. 1-3.*
Dinescu, Gheorghe, et al., "Radio frequency expanding plasmas at low, intermediate, and atmospheric pressure and their applications". Pure Appl. Chem., vol. 80, No. 9, pp. 1919-1930, 2008.*
Proschek, M., et al., "The effect of phase difference between powered electrodes on RF plasmas". Plasma Sources Science and Technology. 14 (2005) pp. 407-411.*
International Search Report and Written Opinion dated Mar. 14, 2011 for PCT Application No. PCT/KR2010/004095, 12 pages.
Korean Office Action dated Feb. 15, 2013 for Application No. 10-2009-0056320, with English Translation, 7 pages.

* cited by examiner

*Primary Examiner* — Bret Chen
(74) *Attorney, Agent, or Firm* — Fish & Richardson P.C.

(57) ABSTRACT

A plasma deposition apparatus and a method of manufacturing a thin film using the same are disclosed. The method of manufacturing a thin film includes introducing a process gas in a reaction chamber of a plasma deposition device, the reaction chamber including a first electrode and a second electrode. The method further includes applying, by a first power supply unit, a first pulsed RF signal to one of the first and second electrodes, and applying, by a second power supply unit, a second pulsed RF signal to one of the first and second electrodes. The first pulsed RF signal and the second pulsed RF signal are applied based on a predetermined deposition variable.

11 Claims, 8 Drawing Sheets

PLASMA DEPOSITION OF A THIN FILM

CROSS REFERENCE TO RELATED APPLICATION

This application claims priority to and the benefit of Korean Patent Application No. 10-2009-0056320 filed in the Korean Intellectual Property Office on Jun. 24, 2009, the entire contents of which are incorporated herein by reference.

BACKGROUND

1. Field of the Disclosure

This disclosure relates to plasma deposition of a thin film.

2. Description of Related Art

Recently, as existing energy sources such as petroleum and coal are expected to be depleted, interest in alternative energy sources for replacing the existing energy sources is increasing. Among alternative energy sources, solar cells that generate electric energy from solar energy have received attention.

A solar cell may be classified into a solar cell using solar heat and a solar cell using solar light. A solar cell using solar light may be formed using single crystal silicon, polysilicon, amorphous silicon, etc. The solar cell formed of crystalline silicon is costly, considering its heat generation efficiency, and is manufactured through a complex process.

Because of these reasons, interests in a thin film solar cell are recently increasing and a thin film solar cell with high efficiency has been actively developed.

A plasma enhanced chemical vapor deposition (PECVD) apparatus using plasma is used to form thin films formed of amorphous silicon or microcrystalline silicon. The amorphous or microcrystalline silicon thin films can be used for a thin film solar cell, a thin film transistor, etc.

Use of a PECVD apparatus that generally uses a high frequency power may increase a deposition rate of the thin film, but may cause a reduction in the quality of the thin film. The PECVD apparatus has to uniformly and densely deposit a radical, for example $SiH_3$, on the surface of a substrate so as to improve the quality of the thin film. However, if the PECVD apparatus deposits the thin film at a very high deposition rate, the radical does not deposit uniformly and densely on the surface of the substrate.

SUMMARY

In one general aspect, a process includes introducing a process gas in a reaction chamber of a plasma deposition device, the reaction chamber including a first electrode and a second electrode, supplying, from a first power source to the first electrode, a first pulsed signal with a first duty cycle and a first frequency, and supplying, from a second power source to the second electrode, a second pulsed signal with a second duty cycle and a second frequency, the first frequency being different than the second frequency, wherein the first pulsed signal and the second pulsed signal are supplied having an overlap portion during which a portion of a period during which the first pulsed signal is in an on state overlaps a portion of a period during which the second pulsed signal is in an on state.

Implementations can include one or more of the following features. For example, the overlap portion is equal to from about 10% to about 20% of a total duration of the period during which the first pulsed signal is in an on state. The process also includes, at an end of the overlap period, transitioning the first pulsed signal to an off state and maintaining the second pulsed signal in the on state. The process also includes, after transitioning the first pulsed signal to the off state and before transitioning the first pulsed signal to the on state, transitioning the second pulsed signal to an off state. The first frequency is approximately equal to a value from about 30 MHz to about 100 MHz, and the second frequency is approximately equal to a value from about 0.5 MHz to about 13.56 MHz. The first duty cycle is different than the second duty cycle. Supplying the first pulsed signal includes setting, with a controller, the first duty cycle and the first frequency, and supplying the first pulsed signal having the set first duty cycle, the set first frequency, and supplying the second pulsed signal includes setting, with the controller, the second duty cycle, the second frequency, and a duration of the overlap period, and supplying the second pulsed signal having the set second duty cycle, the set second frequency, and the set overlap period.

In another general aspect, a plasma deposition apparatus includes a reaction chamber including a first electrode and a second electrode, a first power supply unit configured to supply a first pulsed signal to one of the first electrode and the second electrode, the first pulsed signal having a first duty cycle and a first frequency, a second power supply unit configured to supply a second pulsed signal to one of the first electrode and the second electrode, and a controller controlling the first power supply unit and the second power supply unit to produce an overlap period during which a portion of a period during which the first pulsed signal is in an on state overlaps a portion of a period during which the second pulsed signal is in an on state.

Implementations can include one or more of the following features. For example, the first frequency is set between 30 MHz to 100 MHz, and the second frequency is set between 0.5 MHz to 13.56 MHz. The first duty cycle is different from the second duty cycle. The first duty cycle is the same as the second duty cycle. A duration of the overlap period is equal to from approximately 10% to approximately 20% of a total duration of the period during which the first pulsed signal is in an on state. The controller controls the first power supply unit and the second power supply unit to, at the end of the overlap period, transition the first pulsed signal to an off state and maintain the second pulsed signal in an on state. The controller controls the first power supply unit and the second power supply unit to, after the first pulsed signal is transitioned to the off state and before the first pulsed signal is again transitioned to the on state, transition the second pulsed signal to an off state. Each of the first and second power supply units includes a pulse generating source, a matching circuit, and a filter. The first electrode is installed at a top of the reaction chamber and the second electrode installed at a bottom of the reaction chamber.

In another general aspect, a process includes introducing a process gas in a reaction chamber of a plasma deposition device, the reaction chamber including a first electrode and a second electrode, setting, with a controller, a first duty cycle, a first frequency, a second duty cycle, a second frequency, and a duration of an overlap period, the overlap period being a time period during which a portion of a period during which a first pulsed signal is in an on state overlaps a portion of a period during which a second pulsed signal is in an on state, supplying, from a first power source to one of the first electrode and the second electrode, the first pulsed signal having the set first duty cycle and the set first frequency, and supplying, from a second power source to one of the first electrode and the second electrode, the second pulsed signal having the set second duty cycle and the set second frequency such that the first pulsed signal and the second pulsed signal define the set overlap period.

Implementations can include one or more of the following features. For example, the duration of the overlap period is equal to from about 10% to about 20% of a total duration of the period during which the first pulsed signal is in an on state. The process also includes, at the end of the overlap period, transitioning the first pulsed signal to an off state and maintaining the second pulsed signal in an on state. The process also includes, after transitioning the first pulsed signal to the off state and before the first pulsed signal is again transitioned to an on state, transitioning the second pulsed signal to an off state.

In another general aspect, a plasma deposition apparatus includes a reaction chamber inside which a first electrode and a second electrode are installed. A first power supply unit applies a first pulsed RF signal to one of the first and second electrodes, and a second power supply unit applies a second pulsed RF signal to one of the first and second electrodes. The first pulsed RF signal and the second pulsed RF signal are performed based on a previously determined deposition variable, wherein the deposition variable includes at least one of a cycle, on/off time points (or delay time), on-time and off-time, and a duty cycle of a pulse.

The first power supply unit is a high frequency power supply unit, and the second power supply unit is a low frequency power supply unit. The first pulsed RF signal is a high frequency pulse signal having a frequency of 30 MHz to 100 MHz, and the second pulsed RF signal is a low frequency pulse signal having a frequency of 0.5 MHz to 13.56 MHz.

The first pulsed RF signal is applied to one of the first and second electrodes so as to maximize $SiH_3$ radical by adjusting an electron density or a plasma density. The second pulsed RF signal is applied to one of the first and second electrodes so as to control a behavior of charges (for example, ions, radicals, and charged particles) inside plasma.

Accordingly, lifetime, density, etc. of $SiH_3$ radical depending on generation conditions (for example, an amount of gas, applied power, and pressure) of plasma are determined by a previously conducted experiment. A deposition variable suitable for a thin film to be deposited is determined, and plasma characteristics, such as an electron density and an electron temperature of plasma are controlled depending on the deposition variable. Hence, the thin film with high quality can be manufactured.

For example, cycles of the first and second pulsed RF signals may be different from each other, and duty cycles of the first and second pulsed RF signals may be different from each other. Alternatively, cycles of the first and second pulsed RF signals may be equal to each other, and duty cycles of the first and second pulsed RF signals may be equal to each other. Further, on/off-time points (or delay time) of the first and second pulsed RF signals may be adjusted. At least one of the period, the duty cycle, or on/off-time may be adjusted instead of the on/off-time points.

For example, in case of adjusting the on/off-time points, on/off-time points of the first pulsed RF signal may be equal to the on/off-time points of the second pulsed RF signal.

Further, the on/off-time points of the first pulsed RF signal may be different from the on/off-time points of the second pulsed RF signal. Specifically, the on-time point of the second pulsed RF signal may be positioned in an on-period of the first pulsed RF signal, and the off-time point of the second pulsed RF signal may be positioned in an off-period of the first pulsed RF signal. An overlapping period of the first pulsed RF signal and the second pulsed RF signal may occupy 10% to 20% of the on-period of the first pulsed RF signal. Further, an on-time point of the second pulsed RF signal may be equal to an off-time point of the first pulsed RF signal, and wherein an off-time point of the second pulsed RF signal may be equal to an on-time point of the first pulsed RF signal.

Each of the first and second power supply units may include a pulse generating source, a matching circuit, and a filter.

The first pulsed RF signal may be applied to one of the first and second electrodes, and the second pulsed RF signal may be applied to the other electrode. In this case, the first pulsed RF signal may be applied to the first electrode installed at the top of the reaction chamber, and the second pulsed RF signal may be applied to the second electrode installed at the bottom of the reaction chamber. Further, both the first and second pulsed RF signals may be applied to the same electrodes. That is, both the first and second pulsed RF signals may be applied to the first electrode. On the contrary, both the first and second pulsed RF signals may be applied to the second electrode.

In another aspect, there is a method of manufacturing a thin film using a plasma deposition apparatus, the method including providing a reaction chamber inside which first and second electrodes are installed, connecting a first power supply unit applying a first pulsed RF signal to one of the first and second electrodes, connecting a second power supply unit applying a second pulsed RF signal to one of the first and second electrodes, and applying the first and second RF signals based on a deposition variable determined for controlling plasma characteristics, such as an electron density and an electron temperature of plasma, wherein the deposition variable includes at least one of a cycle, on/off-time points (or delay time), on/off-time, and a duty cycle of a pulse.

The first power supply unit is a high frequency power supply unit, and the second power supply unit is a low frequency power supply unit. The first pulsed RF signal is a high frequency pulse signal having a frequency of 30 MHz to 100 MHz, and the second pulsed RF signal is a low frequency pulse signal having a frequency of 0.5 MHz to 13.56 MHz.

According to the method, lifetime, density, etc. of $SiH_3$ radical depending on generation conditions (for example, an amount of gas, applied power, and pressure, etc) of plasma are determined by a previously conducted experiment. A deposition variable suitable for a thin film to be deposited is determined, and plasma characteristics, such as an electron density and an electron temperature of plasma are controlled depending on the deposition variable. Hence, the thin film with high quality can be manufactured.

For example, the first and second pulsed RF signals each having a different cycle and a different duty cycle may be applied. Alternatively, the first and second pulsed RF signals having the same cycle and the same duty cycle may be applied. Further, on/off-time points (or delay time) of the first and second pulsed RF signals may be adjusted. At least one of the cycle, the duty cycle, or on/off-time may be adjusted instead of the on/off-time points.

Further, in case of adjusting the on/off-time points, on-time points of the first and second pulsed RF signals may be equal to each other, and off-time points of the first and second pulsed RF signals may be equal to each other. Further, the on/off-time points of the first pulsed RF signal may be different from the on/off-time points of the second pulsed RF signal. Specifically, the on-time point of the second pulsed RF signal may be positioned in an on-period of the first pulsed RF signal, and the off-time point of the second pulsed RF signal may be positioned in an off-period of the first pulsed RF signal. An overlapping period of the first pulsed RF signal and the second pulsed RF signal may occupy 10% to 20% of the on-period of the first pulsed RF signal. Further, an on-time point of the second pulsed RF signal may be equal to an off-time point of the first pulsed RF signal, and wherein an off-time point of the second pulsed RF signal may be equal to an on-time point of the first pulsed RF signal.

The first pulsed RF signal may be applied to one of the first and second electrodes, and the second pulsed RF signal may be applied to the other electrode. In this case, the first pulsed RF signal may be applied to the first electrode installed at the top of the reaction chamber, and the second pulsed RF signal may be applied to the second electrode installed at the bottom of the reaction chamber. Further, both the first and second pulsed RF signals may be applied to the same electrodes. That is, both the first and second pulsed RF signals may be applied to the first electrode. On the contrary, both the first and second pulsed RF signals may be applied to the second electrode.

DETAILED DESCRIPTION OF THE EMBODIMENTS

Figure 1:
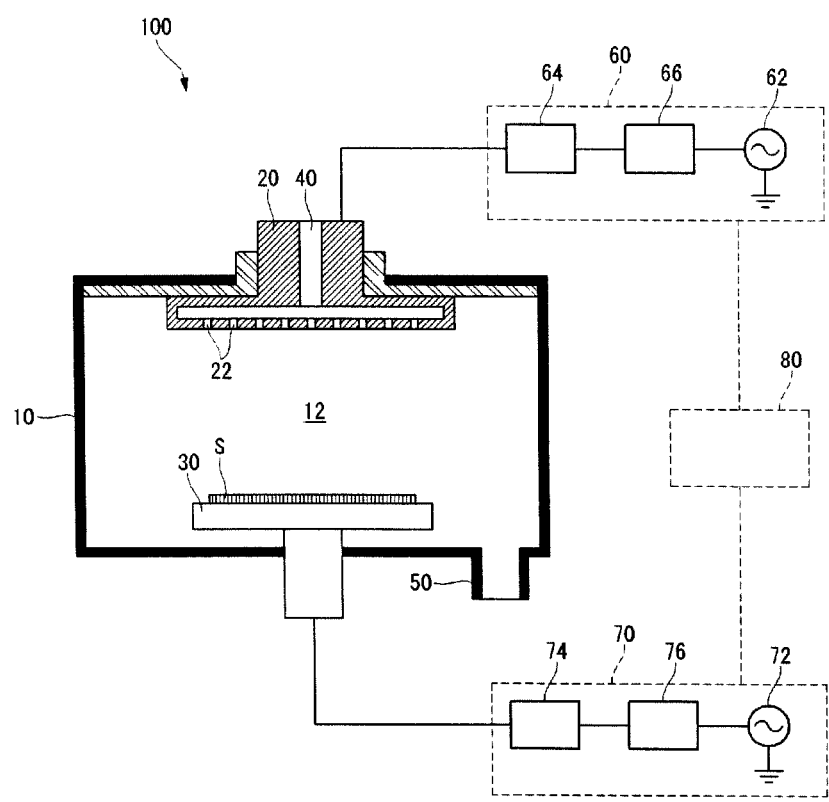
FIG. 1 schematically illustrates a configuration of a plasma deposition apparatus.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

FIG. 1 schematically illustrates an example of a configuration of a plasma deposition apparatus. As shown in FIG. 1, a plasma deposition apparatus 100 includes a reaction chamber 10, a first electrode 20 positioned inside the reaction chamber 10 and a second electrode 30 positioned inside the reaction chamber 10. The plasma deposition apparatus 100 also includes a gas inlet 40 for injecting a process gas (for example, silane ($SiH_4$) gas) into the reaction chamber 10, an exhaust outlet 50 for at least partially evacuating a reaction space 12, a high frequency power supply unit 60 for applying a first radio frequency (RF) signal to the first electrode 20 in a pulse form, and a lower frequency power supply unit 70 for applying a second RF signal to the second electrode 30 in a pulse form.

The reaction chamber 10 defines the reaction space 12. A deposition process using plasma is performed in the reaction space 12 and the reaction chamber 10 blocks the reaction space 12 from an outside environment.

The first electrode 20 is installed at the top of the reaction chamber 10 inside the reaction space 12, and the second electrode 30 is installed inside the reaction space 12 at a location opposite the first electrode 20 (for example, at the bottom of the reaction chamber 10). A substrate S is placed on the second electrode 30. Alternatively, the first electrode 20 and/or the second electrode 30 can be installed in different locations. Similarly, the substrate S can be placed over and/or near the second electrode 30.

The first electrode 20 may be formed as a shower head type electrode having a spray hole 22 for spraying the process gas (for example, silane ($SiH_4$) gas) injected through the gas inlet 40 into the reaction space 12. The first electrode 20 may be covered using a conductive material, a semiconductor material, or an insulating material.

The high frequency power supply unit 60 includes a power supply source 62 and a filter 64. The high frequency power supply unit 60 is configured to turn on and turn off a high frequency power signal with a frequency of from about 30 MHz to about 100 MHz to convert the high frequency power signal into a pulsed signal.

The filter 64 may be a notch filter that is adjusted to block a narrow frequency band. The blocked frequency band is set approximately at a frequency of the second pulsed RF signal. Alternatively, a high pass filter can be used that is adjusted to block a frequency of the second pulsed RF signal. The filter 64 may be combined with a matching circuit 66.

When a silicon thin film is manufactured, it is important that an amount of $SiH_3$ radical that is produced or otherwise present is increased or maximized so as to obtain a silicon thin film with a high quality. Silane ($SiH_4$) gas used to manufacture the silicon thin film is injected into the reaction space 12 through the gas inlet 40 and releases various radicals, ions and electrons through a reaction process, such as an ionization process and a decomposition process, inside plasma. Because $SiH_3$ radical among the various radicals is important in manufacturing a thin film with high quality, it is important that an amount of $SiH_3$ radical is greater than an amount of each of SiH radical and/or $SiH_2$ radical, etc. to manufacture a thin film with high quality.

$SiH_3$ radical is mostly generated in plasma having a relatively low electron temperature characteristic. Further, when initial plasma is generated, an amount of $SiH_3$ radical that is generated or present is greater than an amount of other radicals for a short period of time. In particular, a density of the $SiH_3$ radical may be from about 100 to about 1,000 times greater than a density of the SiH radical and the $SiH_2$ radical during a time interval equal to or less than approximately 5 ms from an initial generation time of a plasma under predetermined conditions.

In one example, the high frequency power supply unit 60 applies the first pulsed RF signal to the first electrode 20 to generate a large amount of $SiH_3$ radical. The first pulsed RF signal may provide a lower electron density than is provided if a continuous wave that is not converted into the pulsed signal is applied to the first electrode 20. Thus, using the first pulsed RF signal may generate a large amount of $SiH_3$ radical, as compared with an implementation where a continuous wave is used.

Further, as described above, because a large amount of $SiH_3$ radical is generated in a short period of time from an initial time at which plasma is generated, applying the first pulsed RF signal to the first electrode 20 may further increase the amount of $SiH_3$ radical. Additionally, because a high frequency power signal is used to generate plasma, the thin film may be manufactured at a high speed.

The second electrode 30 may be positioned and/or repositioned (e.g., moved up and down) inside the reaction space 12, and a heater for heating the substrate S may be installed inside the second electrode 30.

The low frequency power supply unit 70 applies the second pulsed RF signal to the second electrode 30 and may include a power supply source 72 and a filter 74 to control a behavior of charges (for example, ions, radicals, and charged particles) inside the plasma. The low frequency power supply unit 70 periodically turns on and turns off a low frequency power signal having a frequency of from about 0.5 MHz to about 13.56 MHz to convert the low frequency power signal into a pulsed signal.

The filter 74 may be a notch filter that is adjusted to block a narrow band. The blocked band is mostly set around a frequency of the first RF signal. A low pass filter can be adjusted for blocking the frequency of the first RF signal. The filter 74 may be combined with a matching circuit 76.

Each of the high frequency power supply unit 60 and the low frequency power supply unit 70 may include a controller (not shown) that is configured to adjust the first RF signal and/or the second RF signal, respectively based on a deposition variable. Control of the high frequency power supply unit 60 and the low frequency power supply unit 70 are discussed in greater detail below. Alternatively or additionally, each of the high frequency power supply unit 60 and the low frequency power supply unit 70 may be connected to a central controller (# from new figure) that is configured to adjust a deposition variable by controlling the first RF signal and the second RF signal, which will be discussed in greater detail below.

High quality microcrystalline silicon used to manufacture certain high efficiency solar cells goes through an incubation state, a nucleation state, a growth state, and a steady state, to achieve crystallization. Thus, microcrystalline silicon is generally grown on an amorphous silicon surface in a columnar shape. In this case, the use of plasma allows for the easy performance of the incubation and nucleation processes of microcrystalline silicon. Further, in case of the generation of plasma silane (SiH4) gas is used. Because silane (SiH4) gas is an electronegative gas, electronegative dust particles are formed inside plasma. Each of the electronegative dust particles has a size of from about several nanometers to about several hundreds of nanometers.

When the second pulsed RF signal is applied to the second electrode 30, a sheath voltage of the plasma changes. Thus, a behavior of microcrystalline silicon formation may be controlled by controlling the first and the second pulsed RF signals.

For example, when the second pulsed RF signal is applied to the second electrode 30, particles of microcrystalline silicon with high quality formed inside the plasma are safely placed on a sample (for example, the substrate) and electronegatively charged silicon particles may be softly landed. Further, the first pulsed RF signal may control the growth size and charge of the silicon particles generated in the plasma depending on the time when the silicon particles are produced and the input voltage used when the silicon particles are produced.

As described above, the first pulsed RF signal generated by the high frequency power supply unit 60 is applied to the first electrode 20 to reduce a density of electrons and to control the growth size and the charge of the silicon particles. The second pulsed RF signal generated by the low frequency power supply unit 70 is applied to the second electrode 30 to control behavior of charged particles or radicals existing in the plasma.

Accordingly, a deposition rate of an example process in which the first and second pulsed RF signals are respectively applied to the first and second electrodes 20 and 30 is less than a deposition rate is achieved when a first RF signal of a high frequency is applied as a continuous wave. However, the deposition rate of the example process is about 70% greater than a deposition rate obtained when only a first RF signal of a low frequency is applied. In other words, the plasma deposition apparatus according to this example may achieve a relatively high deposition rate. Further, because the behavior of $SiH_3$ radical generated by the first pulsed RF signal is controlled by the second pulsed RF signal, the $SiH_3$ radical is uniformly and densely deposited on the surface of the substrate, which achieves manufacture of a thin film having a high quality.

Characteristics of a plasma and characteristics of radicals and charged particles existing in the plasma may be controlled to achieve a desired deposition characteristic, such as a desired deposition rate and/or a desired quality, by controlling a signal parameter of the first and/or the second pulsed RF signals. The controlled signal parameter that can include at least one of a period, relative on/off-time points (or a relative on/off point time delay), on/off-times, and/or a duty cycle of the pulse. Hence, a thin film with high quality may be manufactured at a high speed. In some examples, the period of the pulse indicates a sum of a single on-period and a single off-period of the pulse. The duty cycle of the pulse indicates a value obtained by dividing the on time of the pulse by the period of the pulse.

Lifetime, density, and other attributes of $SiH_3$ radicals generally vary depending on generation conditions of a plasma in which $SiH_3$ radicals are generated, such as an amount of gas, an applied power, and/or and pressure of the plasma. Thus, the affect of one or more signal parameters, referred to as deposition variables, of the first and second pulsed RF signals on the deposition process may be determined by one or more experiments that were previously conducted based on the generation conditions and the deposition conditions of plasma. Before depositing the thin film, deposition variables suitable to achieve desired characteristics of the thin film to be deposited may be determined based on the previously determined affect of the deposition variables.

Figure 2:
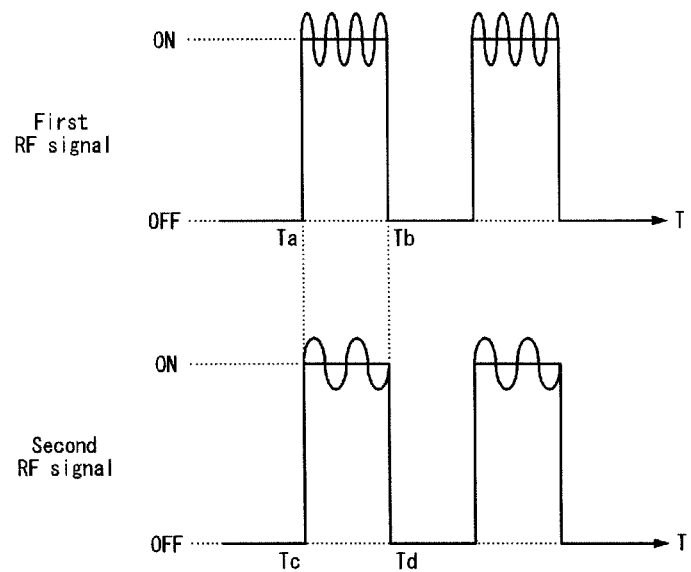
FIGS. 2 to 4 illustrate examples of adjusting on/off-time points of each of first and second pulsed RF signals.
Figure 3:
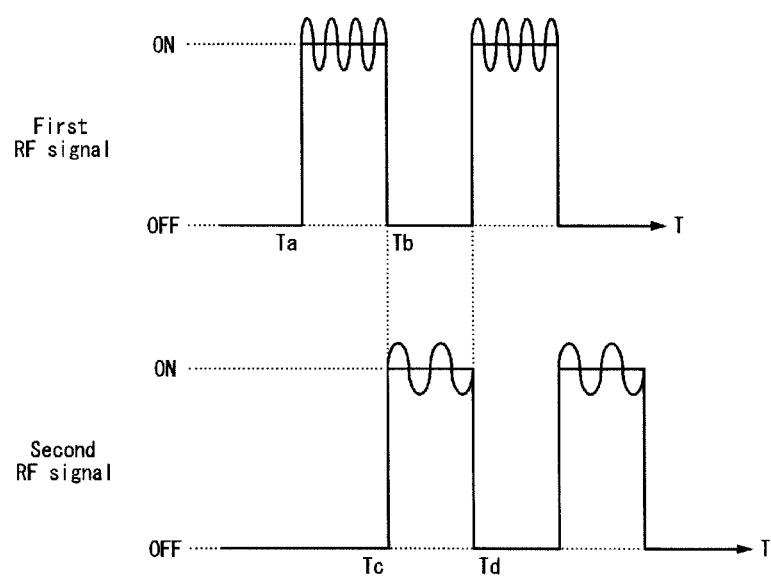
Figure 4:
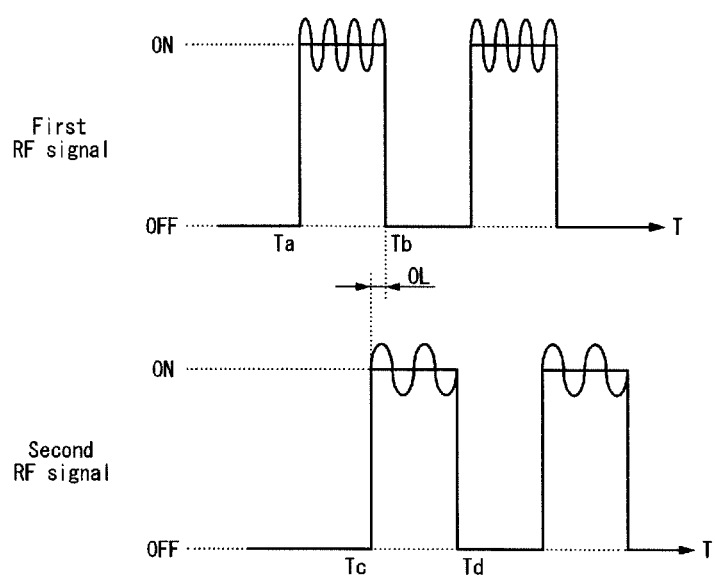

FIGS. 2 through 4 illustrate examples of adjusting on/off-time points of each of the first and second pulsed RF signals. In FIGS. 2 to 4, it is assumed that a period and a duty cycle of the first pulsed RF signal are equal to a period and a duty cycle of the second pulsed RF signal, respectively. For example, in FIGS. 2 through 4, an on-period of the first pulsed RF signal is approximately equal to an off-period of the first pulsed RF signal, and an on-period of the second pulsed RF signal is approximately equal to an off-period of the second pulsed RF signal. Additionally, the on-period of the first pulsed RF signal is approximately equal to the on-period of the second pulsed RF signal. Thus, a duty cycle of each of the first and second FR signals is approximately 0.5.

In FIG. 2, an on-time point Ta and an off-time point Tb of the first pulsed RF signal are approximately equal to an on-time point Tc and an off-time point Td of the second pulsed RF signal, respectively. In FIG. 3, an on-time point Tc of the second pulsed RF signal is approximately equal to an off-time point Tb of the first pulsed RF signal, and an off-time point Td of the second pulsed RF signal is approximately equal to an on-time point Ta of the first pulsed RF signal.

In FIG. 4, an on-time point Tc of the second pulsed RF signal occurs during an on-period of the first pulsed RF signal (i.e., between an on-time point Ta of the first pulsed RF signal and an off-time point Tb of the first pulsed RF signal). An off-time point Td of the second pulsed RF signal occurs during an off-period of the first pulsed RF signal. It is preferable that an overlapping on-time period OL where the first pulsed RF signal and the second pulsed RF signal are on occupies approximately 10% to approximately 20% of the on-period of the first pulsed RF signal. When the overlapping on-time period OL is within the above range, the behavior of $SiH_3$ radical present in the plasma generated by the first pulsed RF signal and the behavior of the particles of microcrystalline silicon used based on $SiH_3$ radical is efficiently controlled.

Figure 5:
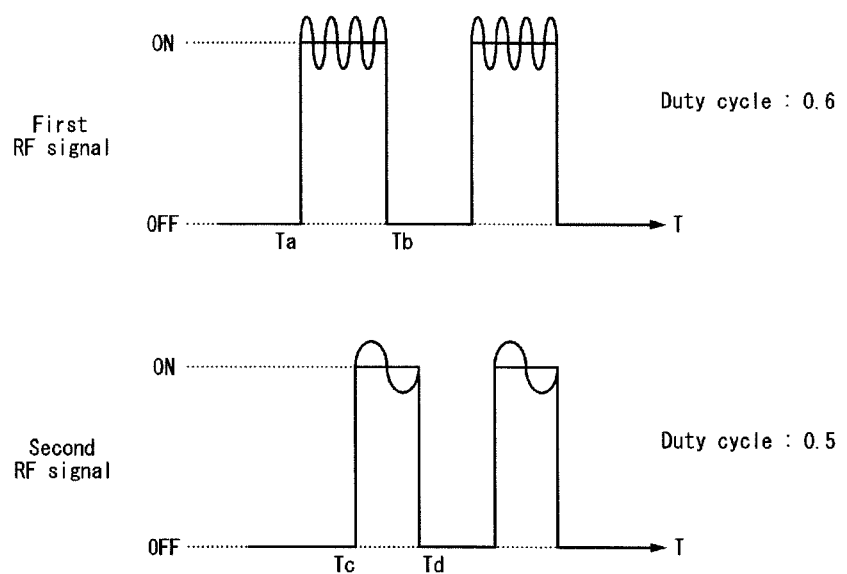
FIG. 5 illustrates an example of adjusting a cycle and a duty cycle of each of first and second pulsed RF signals.

In addition to controlling the relative on-time points and off-time points of the first and second pulsed RF signals, at least one of the period and the duty cycle of one or both of the pulsed RF signals may be controlled. For example, as shown in FIG. 5, periods and duty cycles of the first and second pulsed RF signals may be different from each other. More specifically, an on-period of the first pulsed RF signal is approximately equal to 1.5 times an off-period of the first pulsed RF signal. An on-period and an off-period of the second pulsed RF signal are approximately equal to one another, and are approximately equal to the off-period of the first pulsed RF signal. Therefore, the periods of the first and second pulsed RF signals are different from each other. For example, the duty cycle of the first pulsed RF signal is 0.6 $((1.5)/(1.5+1))$, and the duty cycle of the second pulsed RF signal is 0.5 $((1)/(1+1))$.

The deposition variables and/or other signal parameters of the first and/or the second pulsed RF signals can be controlled by a common controller 80, shown in FIG. 1, for example. Particularly, the controller 80 controls one or more deposition variable, such as an on-time point, an off-time point, a duty cycle, a period, and/or an overlap period, of one or both of the first and second pulsed RF signals based on one or more other signal parameter of the first and/or the second pulsed RF signals. For example, the controller 80 can control the on-time points and the off-time points of both the first and second pulsed RF signals to achieve a desired overlapping on-time period OL for each period of the first and second pulsed RF signals.

Figure 6:
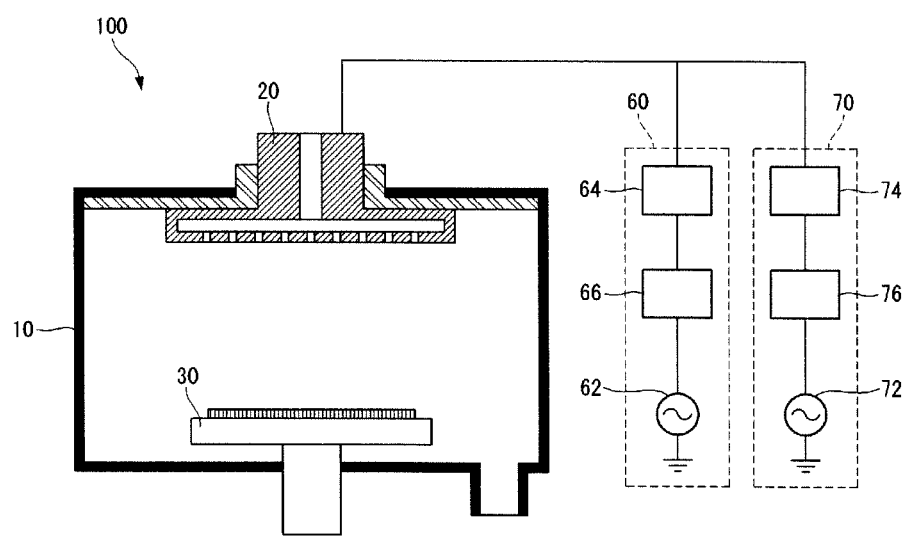
FIGS. 6 and 7 schematically illustrate other configurations of a plasma deposition apparatus.
Figure 7:
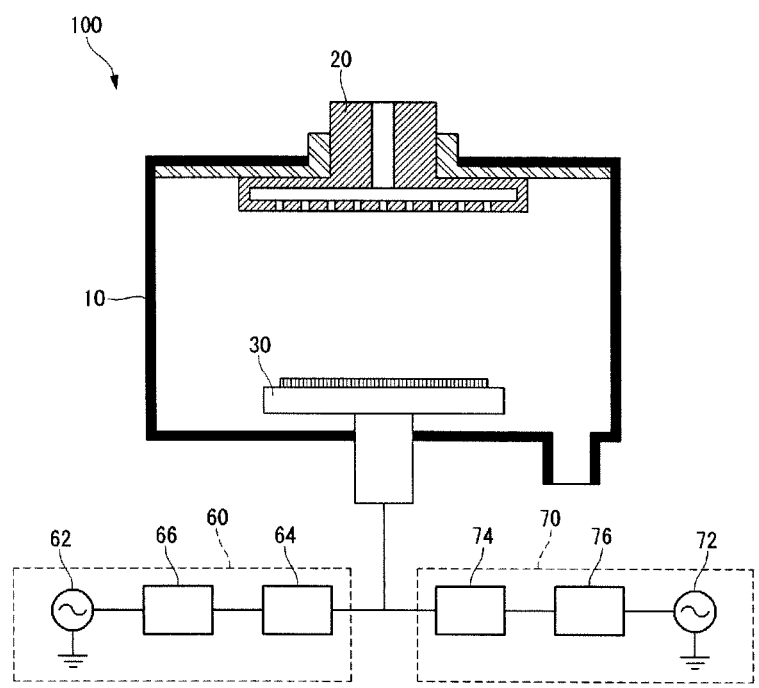

In some examples, the high frequency power supply unit 60 is connected to the first electrode 20, and the low frequency power supply unit 70 is connected to the second electrode 30. However, as shown in FIG. 6, both the high frequency power supply unit 60 and the low frequency power supply unit 70 may be connected to the first electrode 20. Alternatively, as shown in FIG. 7, both the high frequency power supply unit 60 and the low frequency power supply unit 70 may be connected to the second electrode 30.

Figure 8:
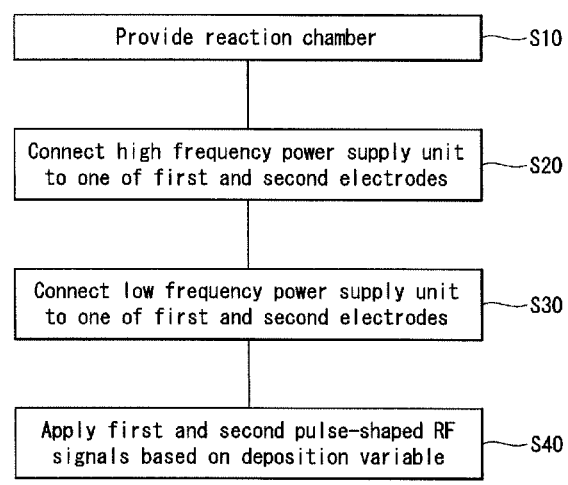
FIG. 8 is a flowchart illustrating a process for manufacturing a thin film.

An example of a process of manufacturing a thin film using a plasma deposition apparatus, such as one of the plasma deposition apparatuses described above, is described below with reference to FIG. 8. As shown in FIG. 8, the reaction chamber inside which the first and second electrodes are installed is provided (S10). A high frequency power supply unit is connected to one of the first and second electrodes (S20) to apply a first pulsed RF signal. A low frequency power supply unit is connected to one of the first and second electrodes (S30) to apply a second pulsed RF signal. The first and second pulsed RF signals are applied based on a deposition variable that is determined to control plasma characteristics, such as an electron density and an electron temperature of plasma, to achieve a desired deposition characteristic (S40).

For example, the deposition variable includes at least one of a period, one or more on-time points or off-time points, one or more on-time or off-time point delay times, one or more on-times or off-times, and a duty cycle of one or both of the pulsed RF signals.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   introducing a process gas in a reaction chamber of a plasma deposition device, the reaction chamber including a first electrode installed at the top of the reaction chamber inside a reaction space of the reaction chamber and a second electrode installed at the bottom of the reaction chamber inside the reaction space, wherein a substrate is positioned on the second electrode;
   supplying, from a first power source only to the first electrode, a first pulsed signal with a first duty cycle and a first frequency; and
   supplying, from a second power source only to the second electrode, a second pulsed signal with a second duty cycle and a second frequency, the first frequency being different than the second frequency;
   wherein the first pulsed signal and the second pulsed signal are supplied having an overlap portion during which a portion of a period during which the first pulsed signal is in an on state overlaps a portion of a period during which the second pulsed signal is in an on state.

2. The method of claim 1, wherein the overlap portion is equal to from about 10% to about 20% of a total duration of the period during which the first pulsed signal is in an on state.

3. The method of claim 1 further comprising, at an end of the overlap period, transitioning the first pulsed signal to an off state and maintaining the second pulsed signal in the on state.

4. The method of claim 3, further comprising, after transitioning the first pulsed signal to the off state and before transitioning the first pulsed signal to the on state, transitioning the second pulsed signal to an off state.

5. The method of claim 1 wherein the first frequency is approximately equal to a value from about 30 MHz to about 100 MHz, and wherein the second frequency is approximately equal to a value from about 0.5 MHz to about 13.56 MHz.

6. The method of claim 1, wherein the first duty cycle is different than the second duty cycle.

7. The method of claim 1, wherein supplying the first pulsed signal includes setting, with a controller, the first duty cycle and the first frequency, and supplying the first pulsed signal having the set first duty cycle, the set first frequency, and
   wherein supplying the second pulsed signal includes setting, with the controller, the second duty cycle, the second frequency, and a duration of the overlap period, and supplying the second pulsed signal having the set second duty cycle, the set second frequency, and the set overlap period.

8. A method comprising:

introducing a process gas in a reaction chamber of a plasma deposition device, the reaction chamber including a first electrode installed at the top of the reaction chamber inside the reaction space and a second electrode installed inside the reaction space at the bottom of the reaction chamber inside the reaction space, a substrate being placed on the second electrode;

setting, with a controller, a first duty cycle, a first frequency, a second duty cycle, a second frequency, and a duration of an overlap period, the overlap period being a time period during which a portion of a period during which a first pulsed signal is in an on state overlaps a portion of a period during which a second pulsed signal is in an on state;

supplying, from a first power source only to the first electrode, the first pulsed signal having the set first duty cycle and the set first frequency; and supplying, from a second power source only to the second electrode, the second pulsed signal having the set second duty cycle and the set second frequency such that the first pulsed signal and the second pulsed signal define the set overlap period.

9. The method of claim 8, wherein the duration of the overlap period is equal to from about 10% to about 20% of a total duration of the period during which the first pulsed signal is in an on state.

10. The method of claim 8 further comprising, at the end of the overlap period, transitioning the first pulsed signal to an off state and maintaining the second pulsed signal in an on state.

11. The method of claim 10, further comprising, after transitioning the first pulsed signal to the off state and before the first pulsed signal is again transitioned to an on state, transitioning the second pulsed signal to an off state.

* * * * *